(12) United States Patent
Mydill

(10) Patent No.: US 6,243,841 B1
(45) Date of Patent: Jun. 5, 2001

(54) AUTOMATED TEST AND EVALUATION SAMPLING SYSTEM AND METHOD

(75) Inventor: Marc R. Mydill, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/087,434

(22) Filed: May 29, 1998

Related U.S. Application Data

(60) Provisional application No. 60/048,049, filed on May 30, 1997.

(51) Int. Cl.$^7$ .................................................. G01R 31/28
(52) U.S. Cl. ......................... 714/724; 714/718; 714/735; 714/738; 714/742; 324/73.1; 365/201; 702/121
(58) Field of Search ..................... 714/724, 735, 714/738, 718, 742, 744; 365/201; 324/73.1, 765; 702/121

(56) References Cited

U.S. PATENT DOCUMENTS

| | | | |
|---|---|---|---|
| 4,792,951 | * 12/1988 | Nielsen | 714/738 |
| 4,807,161 | * 2/1989 | Comfort et al. | 702/121 |
| 5,028,878 | 7/1991 | Carllson et al. | 328/62 |
| 5,051,996 | * 9/1991 | Bergeson et al. | 714/732 |
| 5,151,903 | 9/1992 | Mydill et al. | 714/738 |
| 5,471,145 | 11/1995 | Mydill | 324/601 |
| 5,577,255 | 11/1996 | Roemer et al. | 395/737 |

* cited by examiner

*Primary Examiner*—Emmanuel L. Moise
(74) *Attorney, Agent, or Firm*—Wade James Brady III; Frederick J. Telecky, Jr.

(57) ABSTRACT

An automated test and evaluation sampling system includes a fast pattern memory (130) and a slow pattern memory (137) storing first and second sets of tests states, respectively. Stimulus logic (131) is connected to the fast pattern memory to read the first set of test states at a first rate and stimulate a device under test (133) according to the first set of test states. Compare logic (135) is connected to the slow pattern memory to read the second set of test states at a second rate which is slower on average than the first rate and to compare the second set of test states with a sampled output signal from the device under test.

22 Claims, 3 Drawing Sheets

AUTOMATED TEST AND EVALUATION SAMPLING SYSTEM AND METHOD

This application claims priority under 35 USC § 119(e)(1) of provisional application No. 60/048,049 filed May 30, 1997.

BACKGROUND AND SUMMARY OF THE INVENTION

The present invention relates to sampling Automated Test Equipment ("ATE") for testing digital integrated circuits.

The demand for ever-higher performance in computers, workstations, and consumer products is ongoing. With this evolution comes the need for chips with ever-higher frequencies of operation and pin counts. (As of 1997, chips with hundreds of pins may operate at clock speeds of hundreds of Megahertz, i.e. hundreds of millions of cycles per second.) This makes testing very difficult. Among high speed RISC chips, the latest generation microprocessors, and the higher-end application specific integrated circuits ("ASICs"), there are examples of integrated circuits having a complex functionality and very high speed requirements. As design, simulation, and fabrication methods for digital integrated circuits continuously improve, today's integrated circuit designers and test engineers are becoming increasingly concerned about accuracy, validity, and reliability of the tests used to evaluate the prototype devices. Assuring that the specified performance (with respect to both waveforms and timing edges) is present in these integrated circuits requires an ATE system having matching performance.

Background: Conventional Testers

A major component of ATE systems is pattern memory subsystems. In conventional ATE testers (FIG. 2), the same high speed pattern memory ("HSPM") system supports both the stimulus logic and compare logic. The input stimulus and expected output are described by test patterns which are stored in the large, high speed memories. The maximum functional test rate of the ATE is limited by the frequency with which the test patterns can be executed from memory. Prior art systems require that the entire pattern memory system be capable of supporting the highest frequency of operation of the functional test subsystem. High frequency operations, which are becoming more common with advances in technology, require larger, faster, and more complex test pattern memory subsystems to perform the functional tests.

Background: Sampling Tester

By using a prior art sampling technique, the cost and complexity of the pattern memory system and associated compare circuitry can be substantially reduced.

To cope with high-speed integrated circuits, sampling digital testers have been developed in recent years. Such testers achieve high effective sampling rates by not sampling during every clock cycle, but at fractions of the signal frequency.

The main disadvantage of using conventional sampling techniques is that multiple pattern execution iterations must be performed which increase the test time. However, test pattern execution time is typically a very small percentage of overall test time (for non-memory devices) particularly if the patterns are executed at high frequency. Therefore, the added test time is insignificant.

Some prior art systems utilized a restricted form of sampling supporting a "pin mux" mode of operation. In this mode, pairs of tester stimulus channels are combined to create two device-under-test ("DUT") cycles within one normal tester cycle. This reduces the effective number of tester channels to ½ the normal number of channels. In order to support the 2× test frequency for DUT output comparisons, a two-pass sample can be used (if the ATE does not support automatic combining of compare channels). This method only reduces the pattern memory frequency requirements by 50%, but more significantly cuts the number of available tester channels in half. With increasing test speed requirements and increasing DUT pin counts this approach is very restrictive. A sampling-type tester can reduce the pattern memory frequency requirements much more significantly without sacrificing pin count.

Background: Pattern Memory Bits

ATE systems vary in the number of pattern memory bits used to describe each pattern state for each DUT pin. The basic states typically include, but are not limited to, the following: drive_hi (data bit=1), drive_lo (data bit=0), drive_off expect_hi, expect_lo, and mask. These states are typically encoded taking advantage of mutual exclusivity and/or redundancy. Regardless of the architecture or implementation of pattern controlled pin states, the only states required to operate at full speed in a sampling-type tester are drive_hi and drive_low. Since drive_off is only required to properly load a DUT I/O pin during an output state, it too only needs to occur as frequently as the DUT outputs are being sampled. Therefore, typically only ⅓ of the total pattern information needs to be available at fill speed in a sampling-type tester.

Innovative Sampling Test System

The present application discloses a more cost effective method for ATE testing of integrated circuit chips by using sampling methods that reduce the cost and complexity of pattern memory systems. This method reduces the costs for high speed memory and its associated memory support systems by incorporating a low speed pattern memory ("LSPM") system into the ATE process.

While HSPM is still required for input to a DUT, numerous advantages are obtained with the innovative architecture.

1. Output data is sampled at a slower speed and thus requires a lower cost low-speed memory system. In the case where six common test states are used, at least two states are required at high speed whereas any of the remaining four can be sampled at slow speed. In this case, ⅓ of the total pattern memory is required to run "at speed" while the remaining ⅔ of the pattern memory can run at ⅛th the speed (in a 1:8 sampling ratio). Depending on the particular architecture, anywhere from ½ to ⅔ of the pattern memory system can be implemented with slower, more cost effective, pattern memory. Furthermore, the complexity of the compare and interface logic is reduced due to the reduced speed requirements for the slow pattern memory. Comparisons between DUT output data and expected data occurs at 1/nth the stimulus frequency (where n=the ratio between the stimulus frequency and the compare sample frequency). Therefore, since the sampling data must change for each of the 8 iterations, 8 different compare patterns can be executed in conjunction with the same stimulus. Since there is an 8:1 frequency ratio, each of the 8 compare patterns are ⅛th the length of the stimulus pattern so the total pattern storage requirements are the same as a conventional tester.

2. Another advantage of the disclosed method includes reduced costs for memory and memory support systems related to ATE of integrated circuit chips. The cost of high frequency, high pin count ATE can be reduced by 25% to 75% using this approach.

3. Another advantage of the disclosed method is it permits upgrading of older testers, since the memory systems are modular and new designs can simply be swapped into the existing system.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Conventional ATE monitors DUT outputs at the same frequency as the input stimulus. The input stimulus and expected outputs are described by test patterns. The input data and expected output data is synchronized. The maximum functional test rate of the ATE is limited by the maximum frequency that the test patterns that can be executed. Since these test patterns are stored in large memories, higher frequency operation requires more expensive and/or more complex test pattern memory systems. By using sampling techniques, the cost and complexity of the pattern memory system and associated compare circuitry can be substantially reduced.

Figure 2:
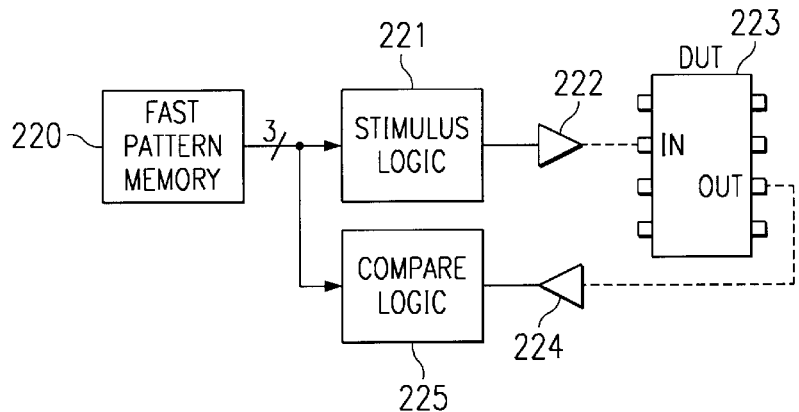
FIG. 2 shows a conventional tester in the prior art.

FIG. 2 shows a prior art tester. In this conventional system, the fast pattern memory system 220 supports both the stimulus logic 221 and response compare logic 225. The fast pattern memory 220 must be able to operate at the speed which the DUT 223 will normally operate, i.e. at the highest frequency for which the system was designed. Each test cycle within a test pattern requires multiple bits of pattern information to drive the stimulus and compare operations. In this example, fast pattern memory system 220 provides eight initial test states to test the device under test 223. The test states are written to the stimulus logic 221 from the fast pattern memory 220 and then transmitted to the input interface logic 222 for input to the DUT 223. Data obtained from the outputs of the DUT 223 are received by output interface logic 224 and transmitted to the compare logic 225. Compare logic 225 accesses the input test states from fast pattern memory 220 and performs a comparison with the output data received from the DUT 223. As mentioned earlier, in this tester configuration, the entire pattern memory system must be capable of supporting the highest frequency of operation of the functional test subsystem. This requirement has a direct impact on the cost and complexity of the pattern memory system.

Figure 3:
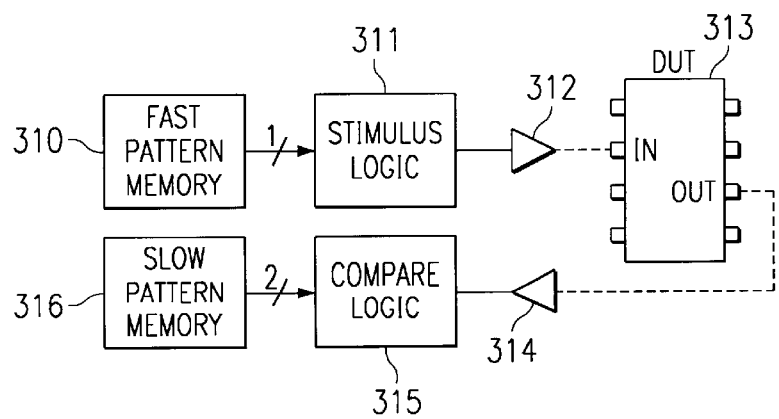
FIG. 3 shows a sampling tester.

FIG. 3 shows an innovative sampling tester. The pattern memory system is comprised of two types of pattern memory—fast and slow. The stimulus logic 311 drives the input interface logic 312 with test bits received from fast pattern memory 310. Inputs of the DUT 313 receive the bit patterns from the input interface logic 312. The compare logic 315 accesses slow pattern memory 316 for expected output data and performs a comparison of the expected data with the output data received from the DUT 313 through the output interface logic 314. As mentioned before, DUT 313 inputs must be driven "at speed," the normal operating frequency of the chip, for fast functional testing. This requires that the fast pattern memory 310, stimulus logic 311, and input interface logic 312 must be capable of operating at high speed. On the other hand, due to the advantages obtained from this innovative method, output interface logic 314, the compare logic 315, and slow pattern memory 316 operate at a much slower speed. In this particular embodiment, only 1 bit of fast pattern memory is required, whereas 2 bits of slow pattern memory are used. Depending on the sampling ratio used, the compare logic 315 can operate at a much lower frequency, as long as multiple test passes are used to delay or "walk" the sample point.

Figure 1:
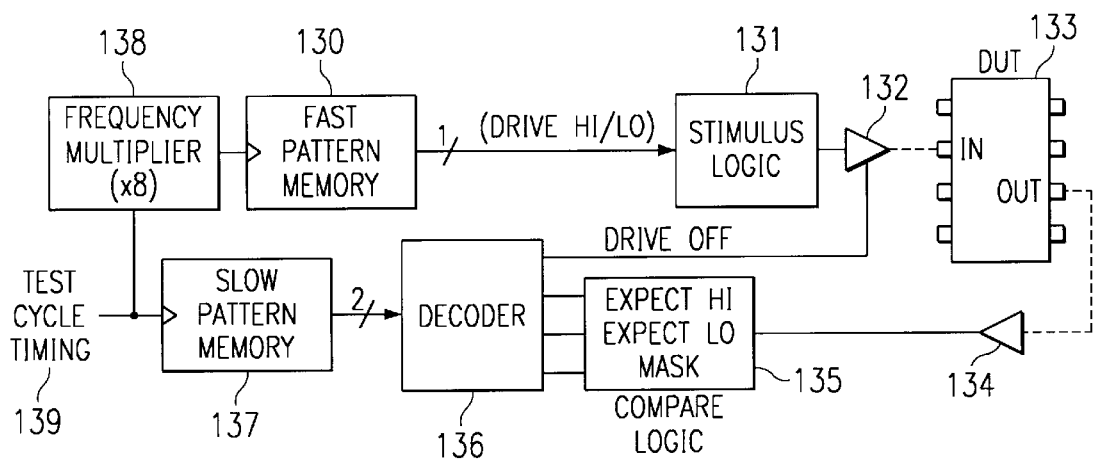
FIG. 1 shows a system incorporating a preferred embodiment.

FIG. 1 shows a more detailed embodiment of an innovative method for reducing cost and complexity of pattern memory sampling systems. Fast pattern memory 130 and slow pattern memory 137 are synchronized by way of a test cycle timing input 139 through an 8:1 frequency multiplier 138. ATE varies in the number of pattern memory bits used to describe each pattern state for each DUT pin. Typically, the basic states are: drive_hi, drive_lo, drive_off, expect_hi, expect_lo, and mask. Fast pattern memory 130 provides 1 bit of data to the stimulus logic 131—drive_hi and drive_low. Stimulus logic 131 drives the input interface logic 132 which inputs the test bits to the DUT 133. Output data from the DUT 133 are transmitted to the compare logic 135 through the output interface logic 134 for comparison with expected output values—expect_hi and expect_lo. The decoder 136 decodes the bit stream from the slow pattern memory 137 and presents the data to the compare logic 135. The decoder also controls the input interface logic 132 using the drive_off state.

Figures 4A, 4B:
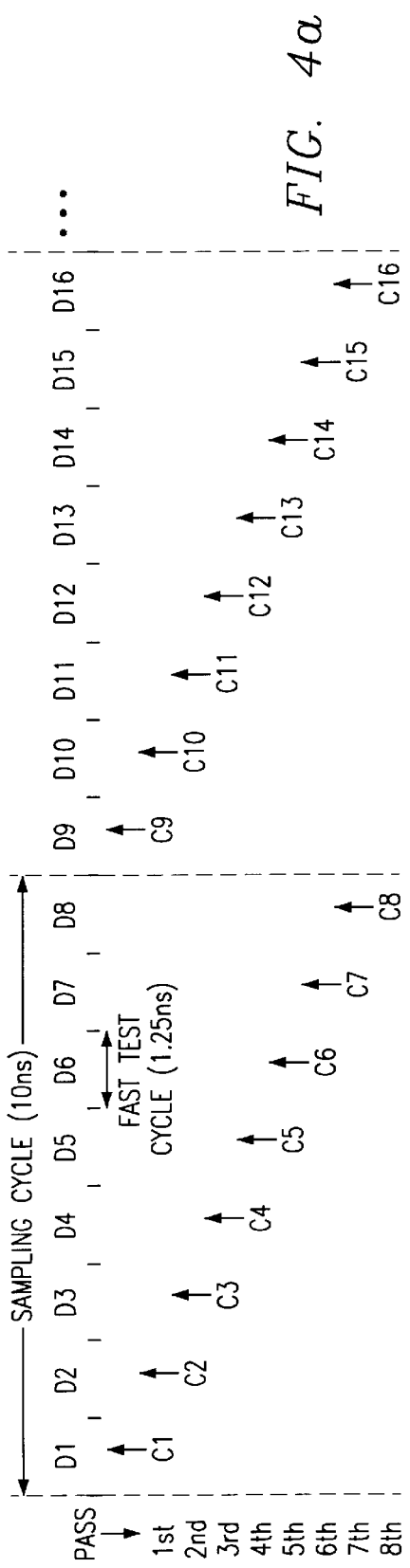
FIG. 4 shows sample execution and pattern memory storage tables.

FIG. 4 shows sampling execution and pattern storage tables. In this example, the sampling cycle is ⅛th of the stimulus frequency. The sampling cycle comprises 8 fast test cycles. On the first pass, the DUT is stimulated 8 times with 2 bits (drive_on and drive_off) of test states while the sampling system takes one sample and performs only one compare. This method of doing eight passes of the same pattern is referred to a eight-way interleaving. On the second pass, the DUT is again stimulated 8 times with the 2-bit data, but the sampling system takes one sample and performs only one compare. The sampling process continues until the desired number of compare data is recorded.

LSPM is used to record the compare results throughout the sampling process. Although the sampling speed is much slower than the stimulus speed, sampling in the megahertz regime fills large amounts of memory very quickly. Since high speed memory is more costly than slow memory, this innovative method impacts memory costs and the support systems required for its operation.

The HSPM is only used above 100 MHz. When executing patterns at over 100 MHz, up to eight pattern executions are required to ensure that all of the received data is applied to the DUT. The HSPM shift register shifts data out at 800 MHz, or every 1.25 ns. Since the HSPM, in the presently preferred embodiment, is 32×8, eight bits are shifted out serially at 800 MHz. It takes ions (1.25 ns×8), to shift out all of the data, therefore the HSPM needs to be accessed every 10 ns, which is equivalent to 100 MHz. The HSPM address, provided by the local Pattern Sequence Controller ("PSC") is running at maximum frequency of 100 MHz. The local PSC is running at the same low frequency as the rest of the system. The LSPM runs at ⅛th the speed of the HSPM, patterns executing at over 100 MHz mode will use an eight-way interleaving ("BY8") method whereby for every LSPM vector executed, 8 HSPM vectors execute. The interleaving involves an eight-pass test of the HSPM data for the drivers in conjunction with the BY8 data for the receivers and LSPM control.

Figure 5:
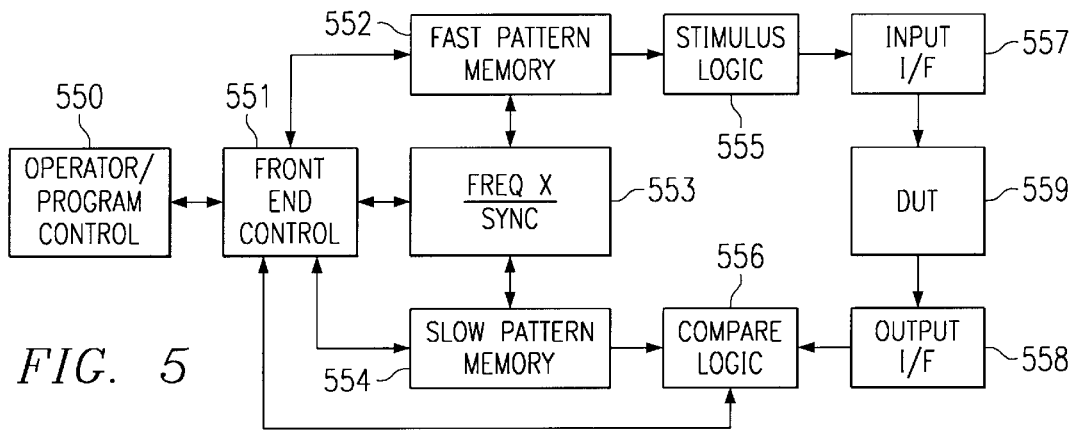
FIG. 5 shows a high level diagram of an overall ATE system.

FIG. 5 shows a high level diagram of an ATE system employing the preferred embodiment. Operator interface and programming control is typically through a computer workstation 550. Control is passed from the computer workstation 550 to front-end control subsystem 551 for distributed control of the various ATE subsystems. Fast pattern memory 552 is loaded with the desired test states as is the slow pattern memory 554 loaded with the expected test results. Front-end control 551 configures the frequency multiplier/synchronizing subsystem 553 and initiates the test process when all systems are ready. Fast pattern memory 552 downloads the test states into the stimulus logic subsystem 555 which then drives the input interface logic 557 to drive the DUT 559. Output interface logic 558 receives the response data from the DUT 559 and passes the data to the compare logic 556. The compare logic 556 then passes the results of the comparison back through front-end control 551 to the computer workstation 550 for ultimate storage and decisionmaking as to the next step in the ATE process.

Figure 6:
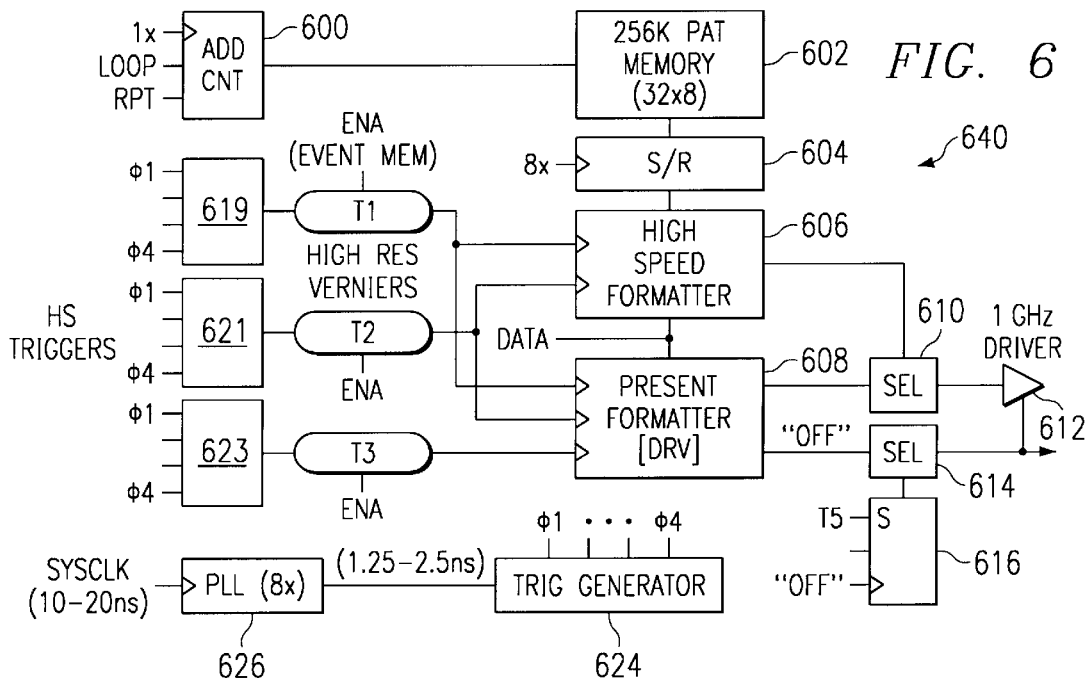
FIG. 6 shows a block diagram of a timing vernier board.

FIG. 6 shows a block diagram of a timing vernier board ("TVB") 640. The TVB 640 can be broken down into four distinct blocks; the I/O section, event memory and shift registers, clock phase fanout, and the individual timing verniers. Each section will be discussed in detail.

The timing vernier section consists of 5 high-resolution timing verniers T1–T5. The high-speed formatter 606 only requires verniers T1 and T2. Therefore, these are the only verniers required to operate at 800 MHz. Verniers T3 and T5 are used for tri-state control and T4 (seen in FIG. 7) is used for the edge compare clock. Verniers T3–T5 only require operation at 100 MHz since they operate with the eight-way interleaving system. Control of the verniers is similar in either the high speed or low speed modes.

The basic components of a timing vernier, in this sample embodiment, are a 10E195 timing vernier with a 2:1 mux for switching in extra edge delay, a 4:1 trigger mux, and a 4:1 enable mux. The output of the 4:1 enable mux goes through another 2:1 mux with a selectable edge delay. The output of this 2:1 mux goes to the input of a flip-flop which is clocked by the trigger mux output. The purpose of this flip-flop is to synchronize the enable signal to the timing vernier with the desired trigger being used. It also holds the 10E195 vernier enable valid for ½ of a sysclk period which is always greater than the duration of the trigger pulse. Depending upon the whether the TVB 640 system is in high speed or low speed mode, which vernier, and the frequency, the triggers may be wider than one PLL period. Without this flip-flop it would be impossible to align the enable signals from the event memory shift register to all four triggers especially when the triggers are wider than one PLL period.

The 2:1 mux between the enable mux and the flip-flop is required to provide adequate setup and hold times at the flip-flop under worse case conditions. The extra edge delay is automatically switched in when either triggers three or four is selected by the trigger mux. This will provide adequate hold time at the flip-flop especially when trigger four is selected.

As previously mentioned, the only parts of the TVB 640 that are required to operate at 800 MHz are the high speed formatter 606 and the high speed shift register 604. The HSPM 602 is only required to operate at 100 MHz. The HSPM 602 is configured as 32k×8 for a total of 256K at 100 MHz rates. For rates above 100 MHz, patterns are limited to 256K or less. The present low speed formatter 608 is multiplexed with the high speed formatter 606 such that the low speed formatter 608 capability can still be used with existing low speed test programs. A selector 610 switches between the high speed formatter 606 and low speed formatter 608 depending upon the mode (old low speed or new high speed test programs) in which the TVB 640 is operating. Driver 612 provides the stimulus signal (up to 1 Ghz) to the DUT.

The high speed formatter 606 only requires timing verniers T1 and T2. Therefore, these are the only timing verniers that need to run up to 800 MHz. The T3 and T5 timing verniers are used for tri-state control and the T4 timing vernier (FIG. 7) is used for edge compare. These three timing verniers only require a maximum frequency of 100 MHz due to the eight way interleaving requirement for high speed compares. When pattern executes are less than or equal to 100 MHz, all five timing verniers will operate in a similar manner regardless of whether in high speed or low speed mode.

Each TVB 640 will have a PSC 600. The PSC 600 provides high speed pattern addressing for the HSPM 602. It has the capability of doing repeats and loops, but not repeats within loops. The PSC 600 operates at a maximum frequency of 100 MHz since the HSPM 602 is accessed every eight high-speed cycles.

The I/O section comprises the programming function for each vernier. A timing vernier word is a 16-bit word comprising an 8-bit data word, two bits for trigger select, two bits for enable select, one bit for clock delay, one bit for failure status, and one bit for offset formatting. A 4:1 mux is used to select the trigger to the timing verniers. Another 4:1 mux is used to select the enable for the timing verniers. This is all of the programming required for timing verniers T1, T2, and T5.

For the T3 and T4 timing verniers (FIG. 7), a most-significant an (msb) bit is required. It is used to select a pipeline clock for the format data depending on the position of T3 or T4 in the cycle. This is all of the programming required for T3.

Clock phase generation is derived from a high speed clock, a phase-locked loop ("PLL") 626. The PLL 626 is an 8× multiplier of its input signal, sysclk. The PLL 626 is used to generate the phases for all verniers by clocking a 4-bit shift register (trigger generator) 624. The shift register 624 is "seeded" with the appropriate binary value to generate the desired phases. The phases are fanned out to the TVB 640 and used as trigger inputs to the trigger multiplexer of each vernier (e.g. 619, 621, and 623). The phase-to-phase fanout skew is a maximum of 750 ps. This is derived from calculating the maximum phase generation and fanout time delay relative to the PLL edge and subtracting the minimum phase generation and fanout time delay relative to the PLL.

There are four different phase generators on the TVB 640. The first phase generator is used for triggering the T1 and T2 timing verniers. The second and third phase generators are used for triggering the T3, and T4/T5 timing verniers (FIG. 7), respectively. The fourth phase generator clocks the high speed shift register 604. Since there are four phases for each phase generator, there are a total of twelve phases to be fanned out on the TVB 640. All of the twelve phases are sent differentially from an external source to the TVB 640, and all twelve phases are fanned out differentially on the TVB 640. The fanout for all four phases of a particular phase generator are of equal length in edge delay, but the phases for one phase generator are not necessarily matched to the phases for the another phase generator because each phase generator has its own calibration.

Figure 7:
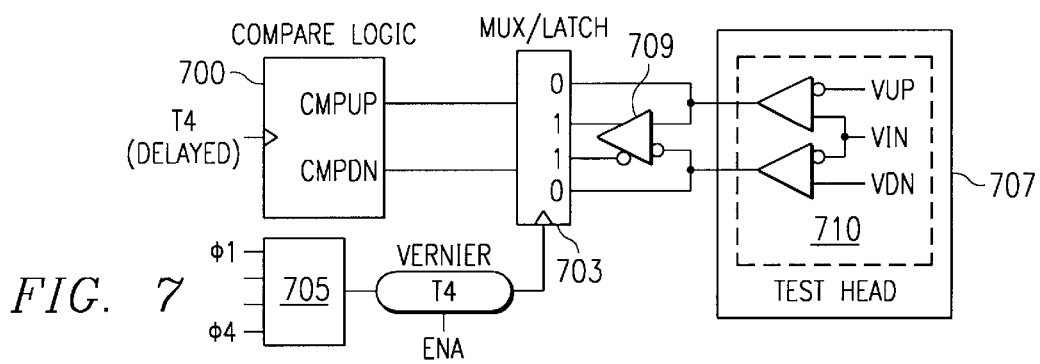
FIG. 7 shows compare logic used by in the preferred embodiment.

FIG. 7 shows the compare logic used in the preferred embodiment. The compare logic 700 uses an additional delay generator to precisely latch high-bandwidth signals from the test head 707. The fail processing is performed by the existing compare logic 700 and clocked using a delayed (non-critical) version of T4. A multiplexer 703 feeds the differential inputs obtained from a test head I/O channel 710 through a differential driver 709 to the compare logic 700. A high-bandwidth differential compare mode will allow a single compare trip reference to create a differential compare signal (as opposed to dual, single ended up and down level compare signals). This will allow both modes of operation (high bandwidth compare and dual reference compare) without affecting existing test head cabling. A timing vernier T4 clocks the multiplexer 703 according to the trigger multiplexer 705 input.

High speed comparisons are done with 8 passes per pattern. Only edge comparisons are allowed in high speed mode. Each high speed compare will execute the expect_data from every 8th cycle, while changing the expect_data and shifting the compare timing between iterations.

Alternative Embodiment: Burst Signal

According to a disclosed class of innovative embodiments for use with chips designed for serial I/O, there is provided an ATE sampling system comprising stimulus logic where stimulus data is transmitted in a burst mode followed by serial burst of comparisons.

Alternative Embodiment: "Expect_Tri-state"

According to disclosed class of innovative embodiments, there is provided that one of the compare states is an "expect_tri-state" output.

An automated test and evaluation sampling system, comprising: a first and a second memory, respectively storing a first and a second set of test states; a stimulus logic operatively connected to at least one signal line of said first memory to read said first set of test states continuously at a first rate, during signal input periods, and said stimulus logic operatively connected to at least one input line of a device under test to stimulate said device under test according to said first set of test states; and a compare logic operatively connected to at least one signal line of said second memory to read said second set of test states from said second memory at a second rate which is slower on average than said first rate, and to compare said second set of test states with at least one sampled output signal from said device under test.

An automated test and evaluation sampling method, comprising the steps of: (a.) providing first and second sets of test states in first and second memories, respectively; (b.) reading said first set of test states from said first memory into a stimulus logic operatively connected by at least one signal line to said first memory; (c.) driving said device under test with said stimulus logic, said stimulus logic operatively connected to at least one input line of said device under test, and operating according to said first set of test states read from said first memory; and (d.) comparing said second set of test states from said second memory in a compare logic with at least one sampled output signal from said device under test, said compare logic operatively connected to at least one signal line of said second memory.

An automated test and evaluation sampling system, comprising: a first and second memory to store a first and second set of digital test states, respectively; a stimulus logic operatively connected to at least one signal line of said first memory to read continuously, during signal input periods, said first set of test states, and said stimulus logic operatively connected to at least one input line of a device under test to stimulate said device under test according to said first set of test states; and a compare logic operatively connected to at least one signal line of said second memory to read said second set of test states from said second memory, and to compare said second set of test states with at least one sampled output signal from said device under test.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

A variety of circuit configurations can be used to implement the disclosed functional relations. For example, some circuit configurations which are used in the different art of sampling digital storage oscilloscopes can be adapted for use with a sampling tester.

What is claimed is:

1. An automated test and evaluation sampling system for testing and evaluating a device under test having at least one input, comprising:

a first memory having at least one signal line and a second memory having at least one signal line, said first memory and said second memory respectively each storing a different one of a first set and a second set of test states;

a stimulus logic operatively connected to said at least one signal line of said first memory to read said first set of test states continuously at a first rate, during signal input periods, said stimulus logic operatively connected to said at least one input line of said device under test to stimulate said device under test according to said first set of test states; and a compare logic operatively connected to said at least one signal line of said second memory to read said second set of test states from said second memory at a second rate which is slower on average than said first rate, and to compare said second set of test states with at least one sampled output signal from said device under test.

2. The sampling system in claim 1, wherein said first memory operates at a speed commensurate with the operating speed of said device under test.

3. The sampling system in claim 1, wherein said first set of test states comprises less than half of the total bits of said test states.

4. The sampling system in claim 1, wherein said compare logic comprises at least one programmable input/output port.

5. The sampling system in claim 1, wherein said stimulus logic comprises at least one programmable input/output port.

6. The sampling system in claim 1, wherein said first and second memories operate synchronously with one another.

7. The sampling system in claim 1, wherein said first memory is faster than said second memory.

8. The sampling system in claim 1, wherein said second set of test states comprises more than half of the total bits of said test states.

9. The sampling system in claim 1, wherein said second set of test states comprises at least drive_off, expect_hi, expect_lo, and mask.

10. The sampling system in claim 1, wherein said first set of test states comprises at least drive_hi and drive_lo.

11. The sampling system in claim 1, wherein said stimulus logic operates at a faster speed than said compare logic.

12. An automated test and evaluation sampling method, comprising the steps of:

(a.) providing a device under test;

(b.) providing first and second sets of test states in first and second memories, respectively;

(c.) reading said first set of test states at a first rate from said first memory into a stimulus logic operatively connected by least one signal line to said first memory;

(d.) driving said device under test with said stimulus logic, said stimulus logic operatively connected to at least one input line of said device under test, and operating according to said first set of test states read from said first memory;

(e.) reading said second set of states from said second memory at a second rate slower than said first rate; and (f.) comparing said second set of states from said second memory in a compare logic with at least one sampled output signal from said device under test, said compare logic operatively connected to at least one signal line of said second memory.

13. The method of claim 12, wherein said first memory operates at a speed commensurate with maximum speed of said device under test.

14. The method of claim 12, wherein said first set of test states comprises less than half of the total bits of said test states.

15. The method of claim 12, wherein said compare logic comprises at least one programmable input/output port.

16. The method of claim 12, wherein said stimulus logic comprises at least one programmable input/output port.

17. The method of claim 12, wherein said first and second memories operate synchronously with one another.

18. The method of claim 12, wherein said first memory is faster than said second memory.

19. The method of claim 12, wherein said second set of test states comprises more than half of the total bits of said test states.

20. The method of claim 12, wherein said second set of test states comprises at least drive_off, expect_hi, expect_lo, and mask.

21. The method of claim 12, wherein said first set of test states comprises at least drive_hi and drive_lo.

22. The method of claim 12, wherein said stimulus logic operates at a faster speed than said compare logic.

* * * * *